United States Patent
Bicksler

(10) Patent No.: US 8,390,051 B2
(45) Date of Patent: Mar. 5, 2013

(54) METHODS OF FORMING SEMICONDUCTOR DEVICE STRUCTURES AND SEMICONDUCTOR DEVICE STRUCTURES INCLUDING A UNIFORM PATTERN OF CONDUCTIVE LINES

(75) Inventor: Andrew Bicksler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/844,560

(22) Filed: Jul. 27, 2010

(65) Prior Publication Data

US 2012/0025402 A1 Feb. 2, 2012

(51) Int. Cl.
*H01L 29/788* (2006.01)

(52) U.S. Cl. ............... 257/316; 438/594; 257/E21.179

(58) Field of Classification Search ............ 438/618, 438/667, 593–594; 257/316–321, E21.179
See application file for complete search history.

(56) References Cited

U.S. PATENT DOCUMENTS

| | | | |
|---|---|---|---|
| 2,586,609 A * | 2/1952 | Burke, Jr. | 257/41 |
| 7,212,435 B2 | 5/2007 | Rudeck et al. | |
| 7,257,024 B2 | 8/2007 | Rudeck et al. | |
| 7,272,039 B2 | 9/2007 | Rudeck et al. | |
| 7,439,841 B2 * | 10/2008 | Kim | 336/200 |
| 7,782,671 B2 * | 8/2010 | Iizuka | 365/185.05 |
| 2009/0180324 A1 | 7/2009 | Ramaswamy et al. | |

* cited by examiner

*Primary Examiner* — Richard A. Booth
(74) *Attorney, Agent, or Firm* — TraskBritt

(57) ABSTRACT

Methods of forming semiconductor device structures are disclosed. One method comprises forming a plurality of loops of a conductive material. Each loop of the plurality of loops comprises a uniform pattern. In one embodiment, a portion of the conductive material is removed from at least one location in each loop of the plurality of loops. Contacts are formed to the conductive material. A semiconductor device structure is also disclosed.

27 Claims, 12 Drawing Sheets

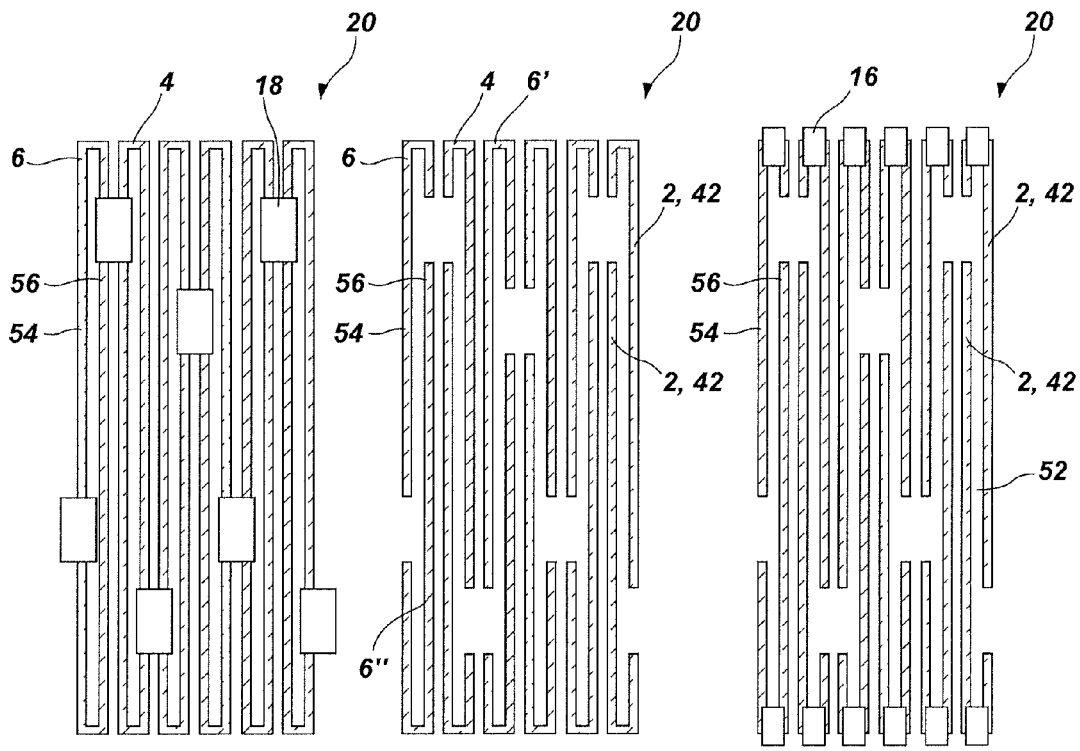
FIG. 16   FIG. 17   FIG. 19
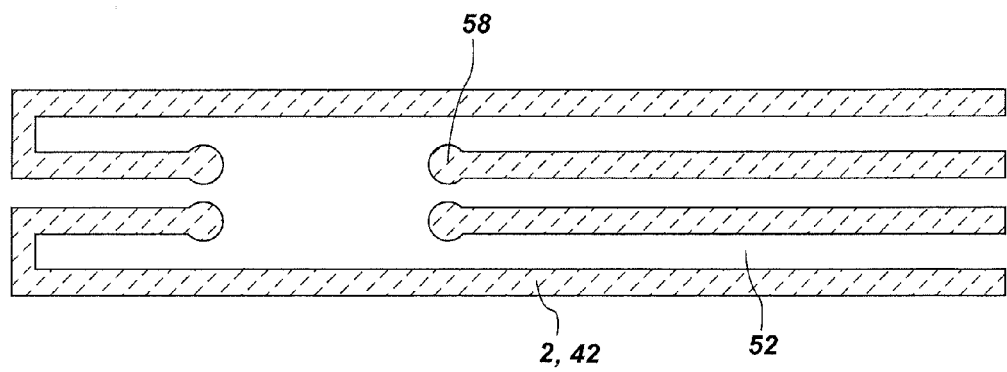
FIG. 18

METHODS OF FORMING SEMICONDUCTOR DEVICE STRUCTURES AND SEMICONDUCTOR DEVICE STRUCTURES INCLUDING A UNIFORM PATTERN OF CONDUCTIVE LINES

TECHNICAL FIELD

Embodiments of the present invention relate to semiconductor device structures having conductive lines (e.g., access lines, such as wordlines) with a uniform pattern and methods of forming such semiconductor device structures.

BACKGROUND

Memory devices provide data storage for electronic systems. One type of memory is a non-volatile memory known as Flash memory. Flash memory is a type of electrically-erasable programmable read-only memory (EEPROM) that is erased and reprogrammed in blocks. Flash memory is popular in wireless electronic devices because it enables the manufacturer to support new communication protocols as they become standardized, and to provide the ability to remotely upgrade the devices for enhanced features. Not-and (NAND) Flash memory includes at least one selecting device coupled in series to a serial combination of memory cells, with the serial combination being commonly referred to as a NAND string. A conventional NAND memory array includes conductive lines, such as access lines (e.g., wordlines) and data lines (e.g., digit lines, such as bit lines), and memory cells, which are located at intersections of the wordlines and bit lines. The memory cells include a source, a drain, a charge storage structure, and a control gate. Individual memory cells are organized into individually addressable groups, such as bytes or words, which are accessed for read, program, or erase operations through address decoding circuitry using wordlines and bit lines.

In one conventional NAND architecture, contact to the wordlines is made utilizing a so-called "shark jaw" layout. FIGS. 1-3 illustrate the wordlines 2 at various stages of fabrication and of making contact to the wordlines 2. So-called "loops" 4 of conductive material 6 are formed (e.g., printed) by conventional techniques, producing a non-uniform pattern, as shown in FIG. 1. Once the conductive material 6 is opened (e.g., discontinuous), each loop 4 forms two wordlines 2. For ease of illustration, FIGS. 1-3 only illustrate a section of the loop 4 of the wordlines 2. In the non-uniform pattern, the distance "X" between first portions 8, 8 of conductive material 6 is narrower than the distance "Y" between second portions 12, 12 of the adjacent conductive material 6 and the distance "Z" between third portions 10, 10 of the conductive material 6. FIG. 1 illustrates sections of three loops 4, with each loop 4 having substantially parallel and substantially perpendicular portions of conductive material 6. First portions 8, 8 of the conductive material 6 are substantially parallel to one another, third portions 10, 10 of the conductive material 6 are substantially perpendicular to first portions 8, 8 and substantially parallel to one another, and second portions 12, 12 of the conductive material 6 are substantially parallel to one another and substantially perpendicular to third portions 10, 10. The increased distances "Y" and "Z" between the second portions 12, 12 of the conductive material 6 and the third portions 10, 10 of the conductive material 6 are utilized to provide sufficient space for contact landing pads 14 and contacts 16 to be formed, as shown in FIGS. 2 and 3. However, the different spacings (e.g., non-uniformity) between the first portions 8, 8, the second portions 12, 12, and third portions 10, 10 of the loops 4 cause difficulties in photolithography acts utilized to form the loops 4. Before forming the contact landing pads 14 and contacts 16, the loops 4 are opened by etching at least a portion of the second portions 12, 12 of the conductive material 6 and the third portions 10, 10 of the conductive material 6 utilizing an aperture 18 in a mask, producing the wordlines 2. However, the mask used to etch the wordlines 2 is complicated and contributes to the complexity of forming the wordlines 2. FIGS. 2 and 3 illustrate six wordlines 2 that are substantially "L-shaped." To connect the wordlines 2, the contact landing pads 14 and contacts 16 are formed at the opened ends of the wordlines 2 by conventional techniques. While the contact landing pads 14 and contacts 16 are aligned at the top of the memory cell, the contact landing pads 14 and contacts 16 become more staggered when located in proximity to slot or drain contacts. Shorting of the resulting wordlines 2 is also common.

It would be desirable to be able to form and provide contacts to conductive lines, such as access lines (e.g., wordlines) without utilizing the shark jaw layout illustrated in FIGS. 1-3, which would enable easier printing of the wordlines.

BRIEF DESCRIPTION OF THE SEVERAL VIEWS OF THE DRAWINGS

FIGS. 16-19 are top down views of the semiconductor device structure of FIG. 14 illustrating opening of wordlines according to an embodiment of the present invention.

DETAILED DESCRIPTION

Figure 1:
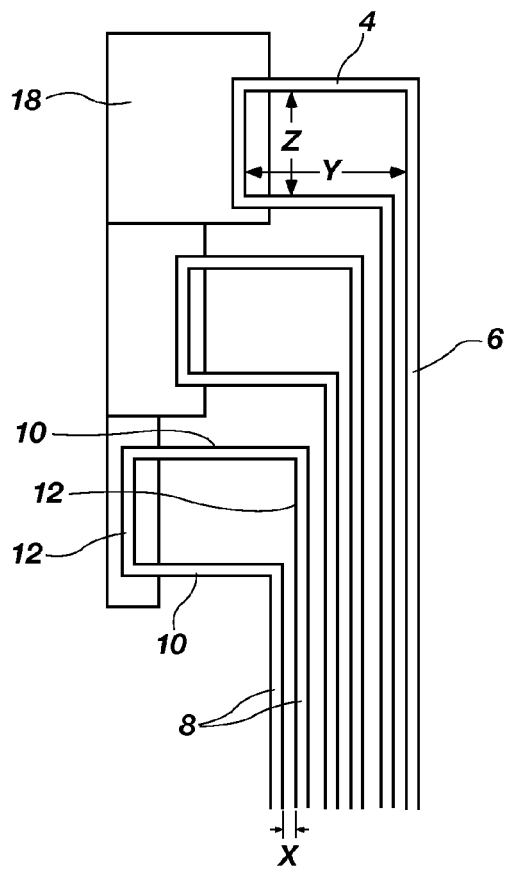
FIGS. 1-3 are schematic illustrations of a prior art wordline configuration having a so-called "shark jaw" layout.
Figure 2:
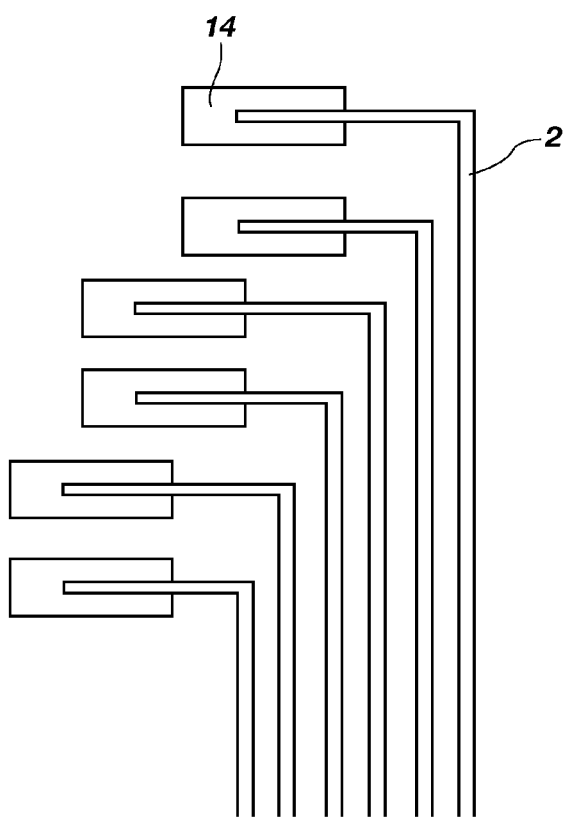
Figure 3:
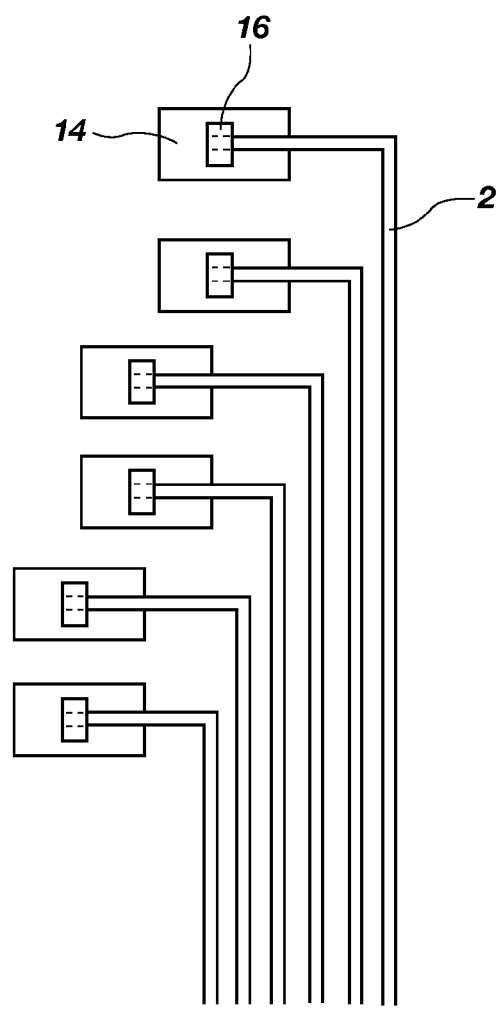

Methods of forming contacts for conductive lines are disclosed, as is a semiconductor device structure including the conductive lines. In one such semiconductor device structure, loops of conductive material having a uniform pattern are formed by a pitch multiplication process. As used herein, the term "uniform pattern" means and includes a pattern of conductive material in which the distance between substantially parallel, horizontal portions of the conductive material in the loop is substantially the same throughout the length of the loop, and the distance between substantially parallel, vertical portions of the conductive material in the loop is substantially the same throughout the width of the loop. The loops may be formed in a substantially rectangular-shape and, thus, provide the uniform pattern. In each of the loops, the distance between parallel portions of adjacent conductive materials is substantially the same throughout the length or width of the loop. Each loop of conductive material is etched in at least one location to open the continuous loop of conductive material and form at least two conductive lines. A mask having a plurality of apertures (e.g., openings) may be positioned over the in-process semiconductor device structure, such that the apertures are over desired locations and used to etch the conductive material. The apertures may be positioned in staggered locations over the semiconductor device structure so that each loop of the conductive material is etched in the desired locations, opening the loops and forming the conductive lines. Contacts may then be formed and connected to the conductive lines. The conductive lines may be used in a memory device, such as in a NAND memory device or other memory device.

The terms "horizontal" and "vertical," as used herein, define relative positions of structures regardless of the orientation of the underlying material, and are orthogonal dimensions interpreted with respect to one another, as illustrated in the drawing being referred to when the structure is being described. As used herein, the term "vertical" means and includes a dimension substantially perpendicular to the dimension referred to with the term "horizontal," which is illustrated in the drawings as extending between left and right sides of the drawing.

The following description provides specific details, such as material types, material thicknesses, and processing conditions in order to provide a thorough description of embodiments of the present invention. However, a person of ordinary skill in the art would understand that the embodiments of the present invention may be practiced without employing these specific details. Indeed, the embodiments of the present invention may be practiced in conjunction with conventional fabrication techniques employed in the industry. In addition, the description provided below does not form a complete process flow for manufacturing a semiconductor device. Only those process acts and structures necessary to understand the embodiments of the present invention are described in detail below. Additional acts to form the complete semiconductor device from the semiconductor device structures may be performed by conventional fabrication techniques.

The materials described herein may be formed by a suitable deposition technique including, but not limited to, spin coating, blanket coating, chemical vapor deposition ("CVD"), atomic layer deposition ("ALD"), plasma enhanced ALD, or physical vapor deposition ("PVD"). Depending on the material to be used, the deposition technique may be selected by a person of ordinary skill in the art. While the materials described and illustrated herein may be formed as layers, the materials are not limited thereto and may be formed in other three-dimensional configurations.

For the sake of example only, the methods and semiconductor device structures are described below in reference to fabricating a NAND FLASH memory device. However, the methods and semiconductor device structures may also be used in other memory devices. The memory devices may be used, by way of non-limiting example, in wireless devices, personal computers, or other electronic devices.

The drawings presented herein are not meant to be actual views of any particular semiconductor device structure, but are merely idealized representations which are employed to describe the present invention. The drawings are not necessarily drawn to scale. Additionally, elements common between drawings may retain the same numerical designation.

Figure 4:
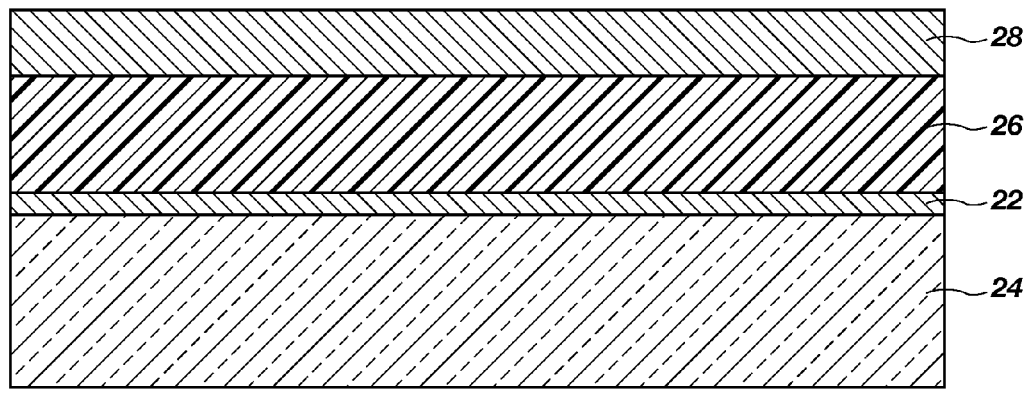
FIG. 4-10 are cross-sectional views of a portion of a semiconductor device structure during various stages of fabrication in accordance with an embodiment of the present invention.

The semiconductor device structure 20 (see FIGS. 14-17 and 19-21) may be produced by forming a tunneling barrier material 22 on a substrate 24, a first conductive material 26 on the tunneling barrier material 22, and a first hardmask material 28 on the first conductive material 26, as shown in FIG. 4. The substrate 24 may be a semiconductor substrate, such as a conventional silicon substrate, or other bulk substrate that includes semiconductor material. As used herein, the term "bulk substrate" means and includes not only silicon wafers, but also silicon-on-insulator ("SOI") substrates, silicon-on-sapphire ("SOS") substrates, epitaxial materials of silicon on a base semiconductor foundation, and other semiconductor materials, such as silicon-germanium, germanium, gallium arsenide, gallium nitride, or indium phosphide. In one embodiment, the substrate 24 is a silicon wafer.

The tunneling barrier material 22 may be formed from a dielectric material, such as a silicon oxide ($SiO_x$) material. The dielectric material may be grown on the substrate 24. In one embodiment, the tunneling barrier material 22 is formed from silicon dioxide ($SiO_2$). The tunneling barrier material 22 may be formed to a thickness of from approximately 65 Å to approximately 85 Å and may function as a tunnel oxide. The first conductive material 26 may be formed from polysilicon, a metal, a metal compound, or combinations of the metal and metal compound. The polysilicon may be undoped, n-doped, or p-doped. The metal or metal compound may include, but is not limited to, platinum, tantalum nitride, a metal silicide, aluminum, or other metal or metal compound gate material (e.g., Ti, TiN, Ta, Ru, Ir, $RuO_2$, $IrO_2$, W, or WN). In one embodiment, the first conductive material 26 is polysilicon, such as n-doped polysilicon or p-doped polysilicon. The first conductive material 26 may be formed to a thickness of from approximately 600 Å to approximately 800 Å, such as approximately 700 Å. The first conductive material 26 may function as a charge storage structure of a memory cell, such as a floating gate of a memory cell, and may also be referred to herein as floating gate 26. The first hardmask material 28 may be a sacrificial material, such as transparent carbon (TC) material or an amorphous carbon (AC) carbon, that is selectively etchable relative to a first spacer material.

Figure 5:
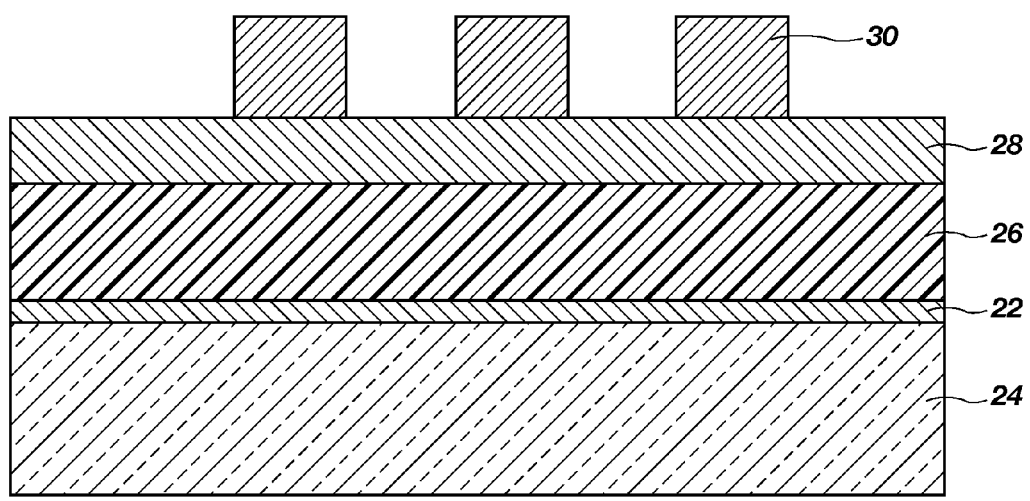
Figure 6:
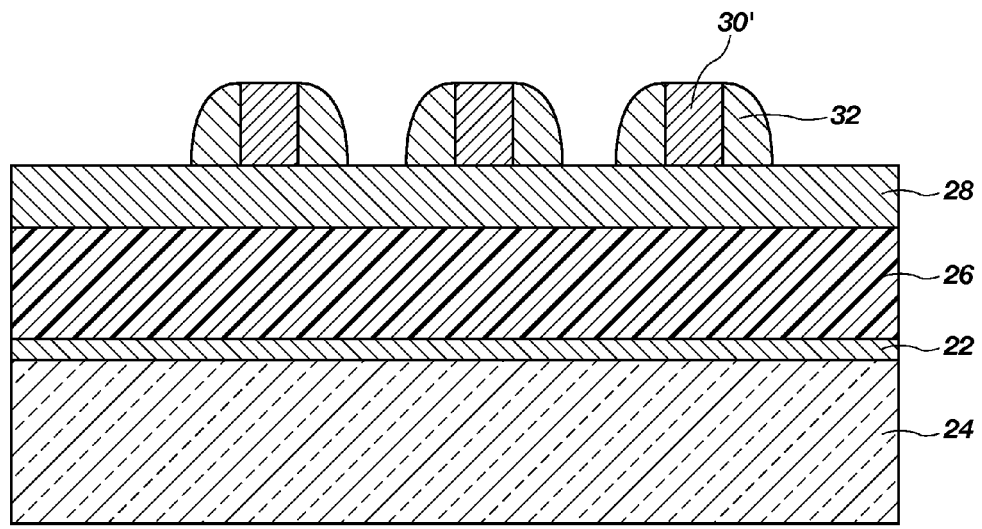

A first resist may be formed over the first hardmask material 28, patterned, and developed to produce a patterned first resist 30, as shown in FIG. 5. The first resist may be a conventional resist material and may be patterned and developed using conventional lithography techniques, which are not described in detail herein. The patterned first resist 30 may have a feature size of greater than or equal to a minimum feature size (F) capable of being achieved by the lithography technique used to pattern the first resist. Example lithography techniques include, but are not limited to, 248 nm and 193 nm photolithography, electron-beam lithography, and X-ray lithography. Resist materials, such as positive and negative resists, are known in the art and, therefore, are not described in detail herein. As shown in FIG. 6, the patterned first resist 30 may be etched or trimmed, reducing its feature size to a feature size of less than F. The sub-minimal line width of the trimmed and patterned first resist 30' may be formed by a self-aligned double patterning (SADP) process, for example. The width of the trimmed and patterned first resist 30' may correspond to the width of shallow trench isolation regions 38 (see FIG. 9) ultimately formed in the semiconductor device structure 20.

A first spacer material may be formed over the trimmed and patterned first resist 30' and etched to produce first spacers 32, as shown in FIG. 6. The first spacer material may be compatible with acts conducted during the fabrication of the semiconductor device structure 20 and with subsequent processing acts. The first spacer material is formed from any material that may be conformally deposited over the trimmed and patterned first resist 30', such as an organic or an inorganic material. By way of non-limiting example, the first spacer material may be silicon nitride ($Si_3N_4$), a $SiO_x$, or polysilicon. In one embodiment, the first spacer material is $SiO_2$. The first spacer material may be substantially conformally deposited on the trimmed and patterned first resist 30', such as by ALD. However, other deposition techniques may be used. The thickness to which the first spacer material is deposited may correspond to the width of pillars 36 (see FIG. 8) ultimately to be formed. The first spacer material may be anisotropically etched to produce the first spacers 32. Etchants used to anisotropically etch the first spacer material may be selected depending upon the spacer material used. By way of non-limiting example, if the first spacer material is $SiO_2$, the anisotropic etch may be a plasma etch, such as a tetrafluoromethane ("$CF_4$")-containing plasma, a trifluoromethane ("$CHF_3$")-containing plasma, a $C_4F_8$-containing plasma, or combinations thereof. If the first spacer material is $Si_3N_4$, the anisotropic etch may be a $CHF_3/O_2$/He plasma or a $C_4F_8/CO/Ar$ plasma.

Figure 7:
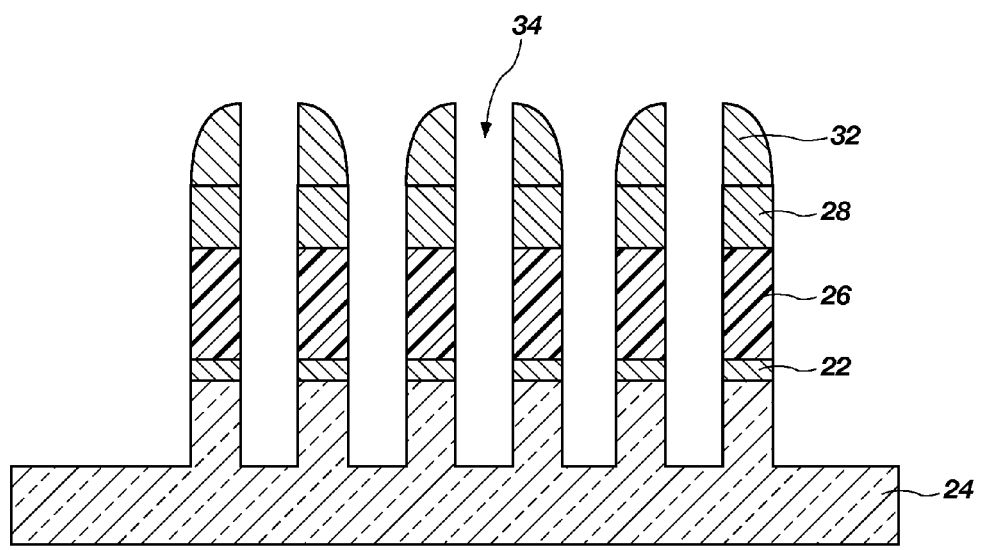

The trimmed and patterned first resist 30' remaining between the first spacers 32 may be removed, such as by etching, forming openings between the first spacers 32. The first spacers 32 may then be used as a mask to pattern the first hardmask material 28, the floating gate 26, and the tunneling barrier material 22, as shown in FIG. 7. The pattern may be transferred into a portion of the substrate 24, forming first trenches 34, which correspond to an active area pattern. The first hardmask material 28, the floating gate 26, the tunneling barrier material 22, and the substrate 24 may be patterned by a single etch process or by multiple etch processes. The etch process(es) used to remove the first hardmask material 28, the floating gate 26, the tunneling barrier material 22, and portions of the substrate 24 may be one or more conventional dry etch processes, which are not described in detail herein.

Figure 8:
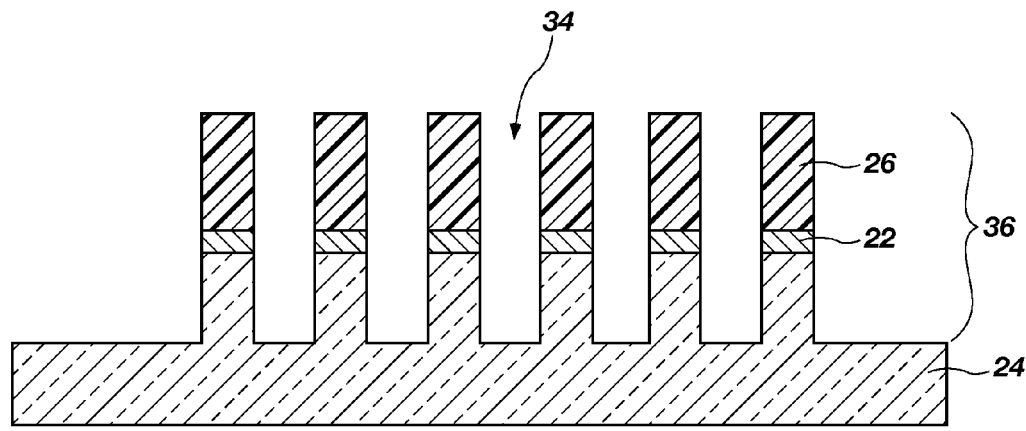
Figure 9:
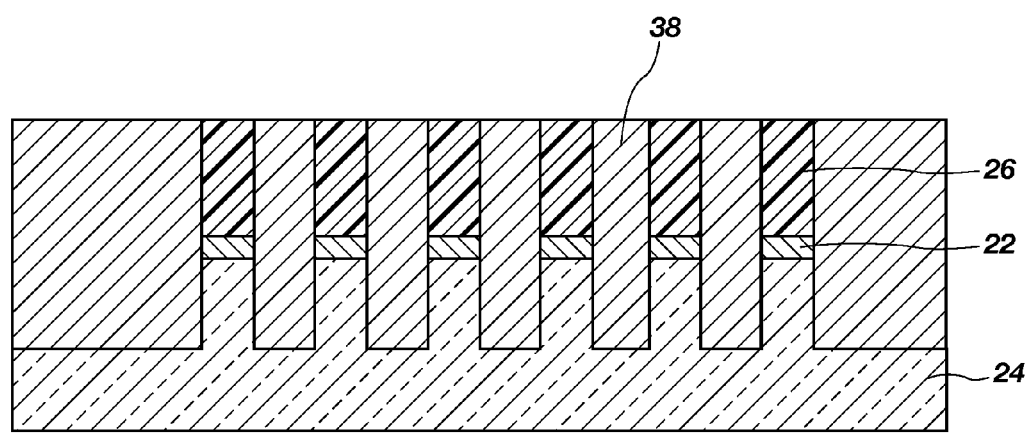
Figure 10:
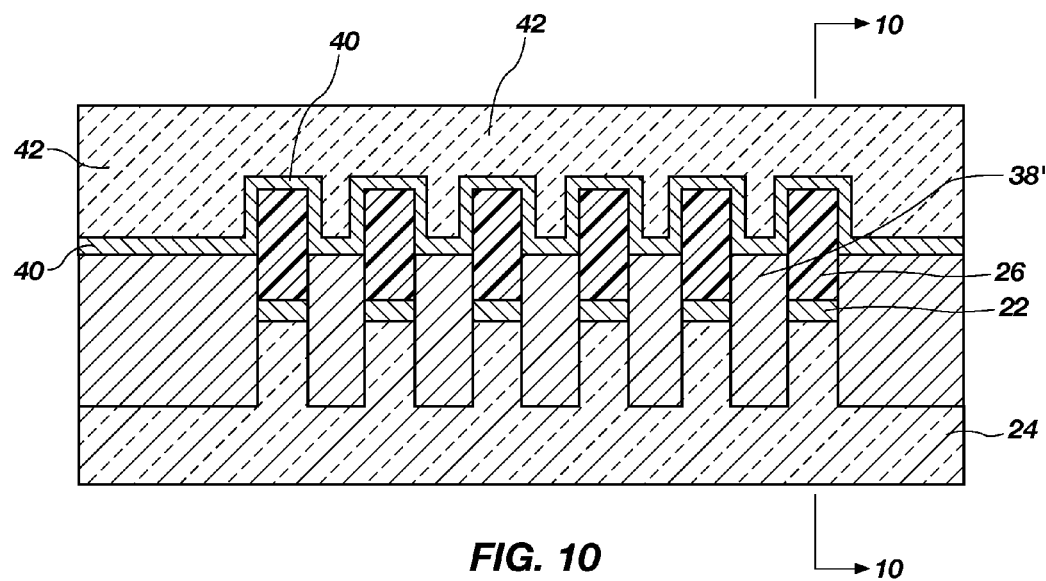

The first spacers 32 and the first hardmask material 28 may then be removed, as shown in FIG. 8, by conventional techniques. The portions of the floating gate 26, tunneling barrier material 22, and substrate 24 underlying the first spacers 32 form pillars 36, while the first trenches 34 extend through the floating gate 26 and tunneling barrier material 22, and into the substrate 24. The first trenches 34 may be filled with a fill material, such as an oxide material. Any fill material overlying the pillars 36 may be planarized, such as by chemical-mechanical planarization (CMP), producing shallow trench isolation structures 38, as shown in FIG. 9. A portion of the fill material in the shallow trench isolation regions 38 may be etched, recessing an area of the shallow trench isolation regions 38 between the floating gates 26, as shown in FIG. 10. Another dielectric material 40 may be formed over the pillars 36 and the recessed shallow trench isolation regions 38'. The dielectric material 40 may be deposited conformally. For convenience, the dielectric material 40 is illustrated in the drawings as a single material. However, the dielectric material 40 may include multiple materials, such as a three-layered stack of silicon dioxide/silicon nitride/silicon dioxide, which is commonly referred to as an ONO stack. A second conductive material and a metal material may be formed over the dielectric material 40. The second conductive material may be polysilicon, for example, such as undoped, n-doped, or p-doped polysilicon. The metal material may be a metal or metal silicide. The metal may be tungsten, for example, and the metal silicide may be, for example, tungsten silicide. The second conductive material and the metal material may function as a control gate, and the combined second conductive material and metal material may be referred to herein as a control gate 42/wordline 2, which is illustrated in the drawings as a single material for convenience. The dielectric material 40 isolates the floating gate 26 from the control gate 42 and prevents charge leakage between the floating gate 26 and the control gate 42.

Figure 11:
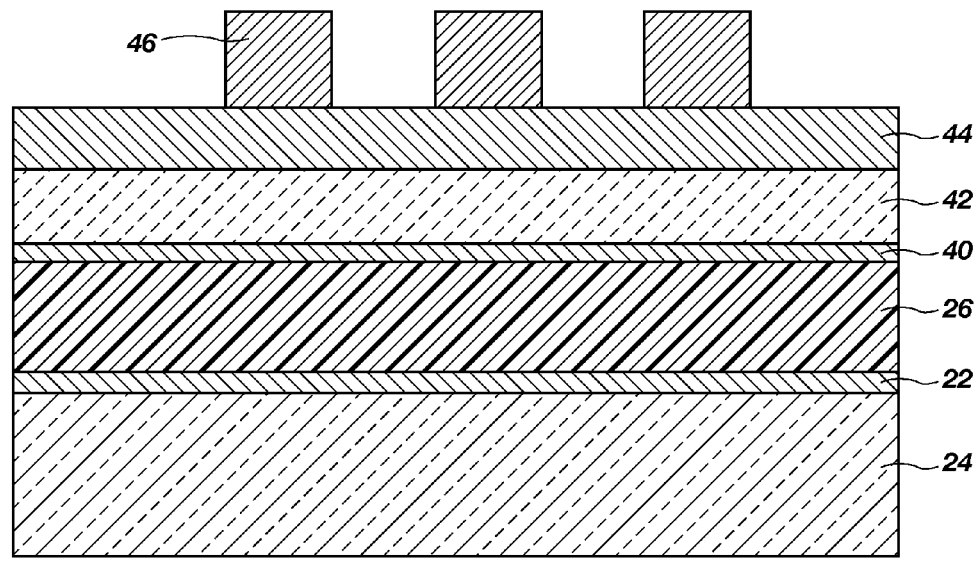
FIGS. 11-14 are cross-sectional views of a portion of the semiconductor device structure of FIG. 10 taken along line 10-10 during various stages of fabrication in accordance with an embodiment of the present invention.
Figure 12:
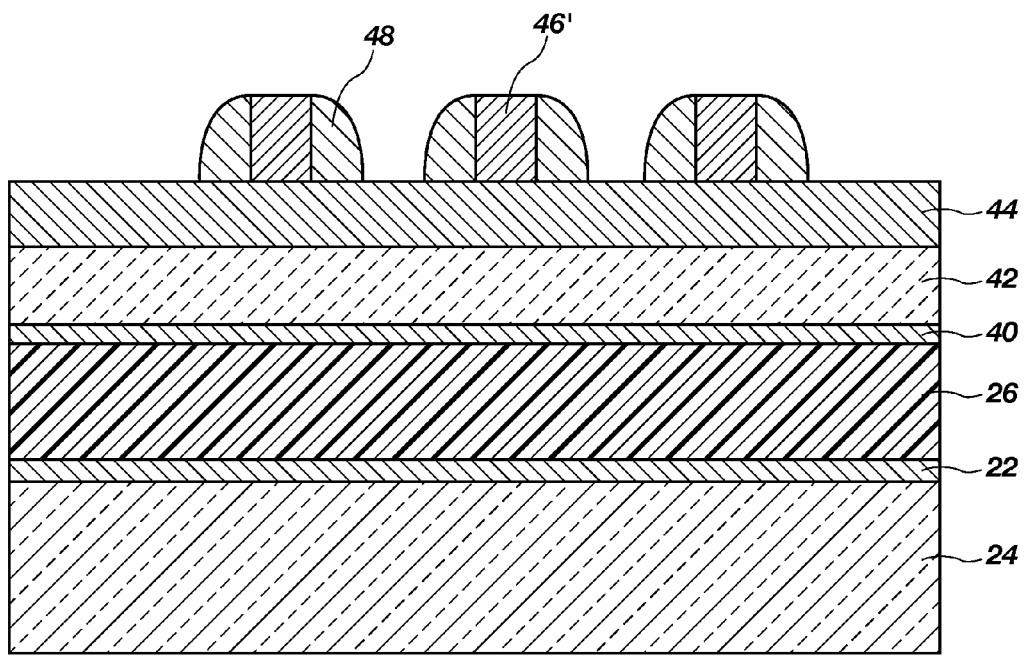

A second hardmask material 44 may be formed over the control gate 42, as shown in FIG. 11. FIG. 11 is a cross-sectional view taken along the line 10-10 in FIG. 10. A second resist may be formed over the second hardmask material 44, patterned, and developed to produce a patterned second resist 46 in a manner similar to that described above with respect to the patterned first resist 30. The patterned second resist 46 may be etched or trimmed, as shown in FIG. 12, reducing its width to a width less than a minimum feature size (F) capable of being achieved by conventional lithography techniques. The width of the trimmed and patterned second resist 46' may correspond to the width of doped regions (not shown) ultimately to be formed in the substrate 24.

A second spacer material may be formed over the trimmed and patterned second resist 46' and etched to produce second spacers 48, as shown in FIG. 12. The second spacer material may be one of the materials described above for the first spacer material. In one embodiment, the second spacer material is a $SiO_x$, such as $SiO_2$. The second spacer material may be substantially conformally deposited on the trimmed and patterned second resist 46', such as by ALD. However, other deposition techniques may be used. The thickness to which the second spacer material is deposited may correspond to the width of the loops 4 of the control gate 42/wordline 2 (see FIGS. 14 and 15) ultimately to be formed in the semiconductor device structure 20. The second spacer material may be anisotropically etched to produce the second spacers 48. Etchants used to anisotropically etch the second spacer material may be selected depending upon the second spacer material used. By way of non-limiting example, if the second spacer material is $SiO_2$, the anisotropic etch may be a plasma etch, such as a tetrafluoromethane ("$CF_4$")-containing plasma, a trifluoromethane ("$CHF_3$")-containing plasma, a $C_4F_8$-containing plasma, or combinations thereof. If the spacer material is $Si_3N_4$, the anisotropic etch may be a $CHF_3/O_2$/He plasma or a $C_4F_8/CO/Ar$ plasma, for example.

Figure 13:
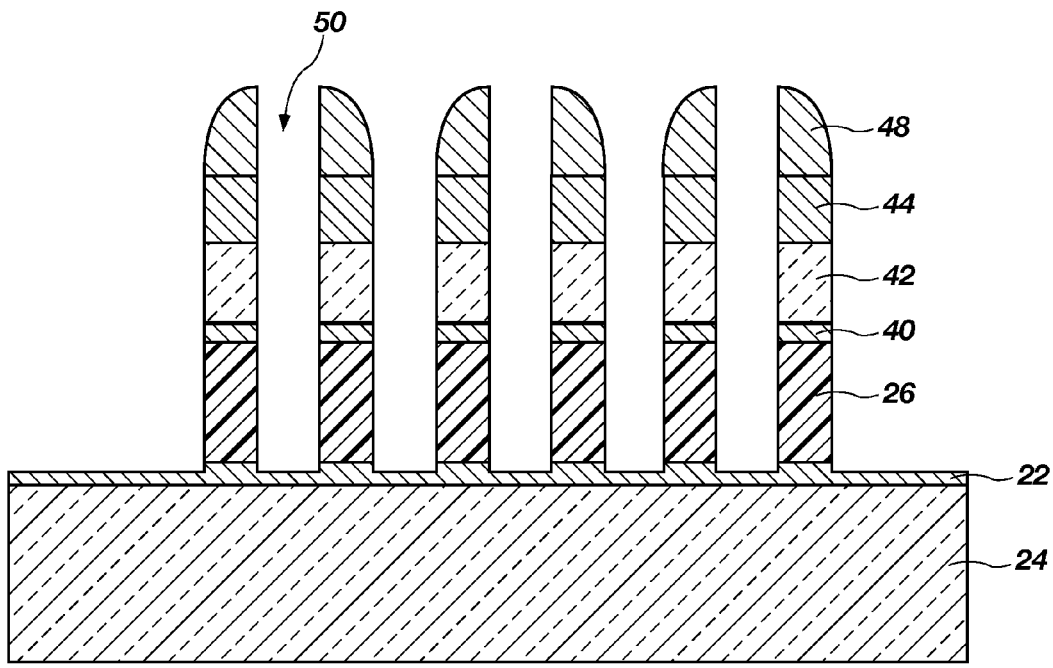

The trimmed and patterned second resist 46' remaining between the second spacers 48 may be removed, such as by etching, forming openings between the second spacers 48. The second spacers 48 may then be used as a mask to pattern the second hardmask material 44, the control gate 42/wordline 2, the dielectric material 40, and the floating gate 26, forming second trenches 50, as shown in FIG. 13. The tunneling barrier material 22 may function as an etch stop. The second hardmask material 44, the control gate 42/wordline 2, the dielectric material 40, and the floating gate 26 may be patterned by a single etch process or by multiple etch processes. The etch processes used to remove portions of the control gate 42/wordline 2, the dielectric material 40, and the floating gate 26 may be one or more conventional dry etch processes, which are not described in detail herein.

Figure 14:
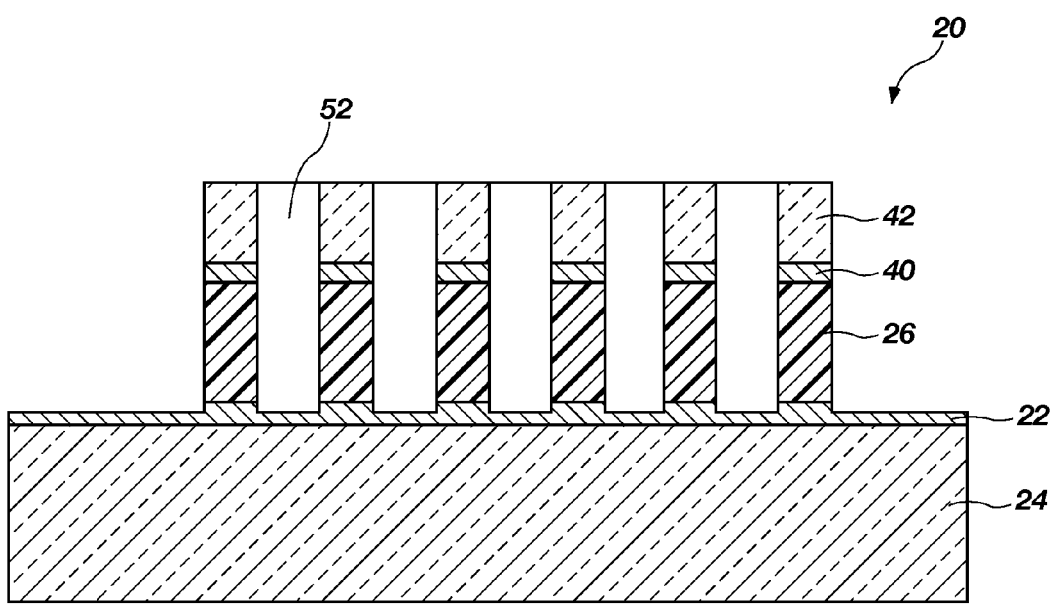

The second spacers 48 and the second hardmask material 44 may be removed, as shown in FIG. 14. The substrate 24 may be implanted with dopants through the second trenches 50 between adjacent control gates 42/wordlines 2, forming source and drain regions (not shown). A dielectric material 52 may be deposited in the second trenches 50 to isolate adjacent floating gates 26 and adjacent control gates 42/wordlines 2. The dielectric material 52 may be an oxide. The dielectric material 52 may then be planarized to remove any material overlying the control gates 42, as shown in FIG. 14, forming the semiconductor device structure 20.

Figure 15:
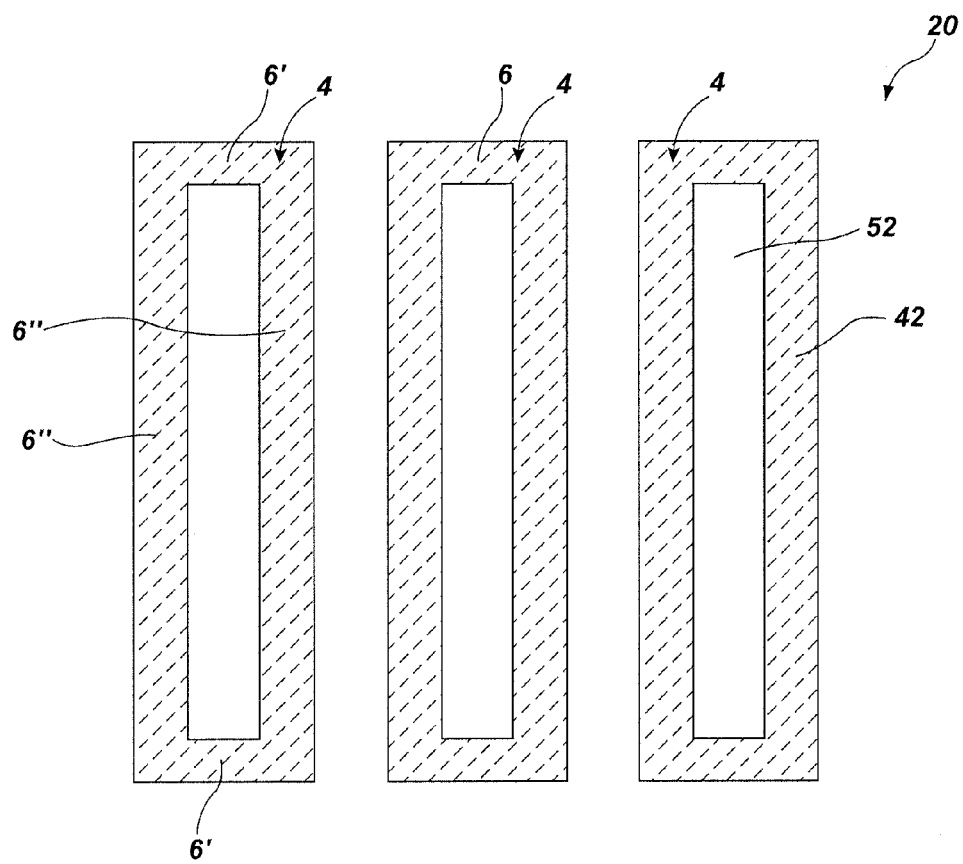
FIG. 15 is a top down view of the semiconductor device structure of FIG. 14.

A top down view of the semiconductor device structure 20 of FIG. 14 is shown in FIG. 15. As illustrated in FIG. 15, the control gates 42 are configured as loops 4 having a substantially rectangular shape. The shape of the loops 4 may be determined by, for example, a pitch multiplication process.

Each loop 4 has a uniform pattern in that the distance between substantially horizontal portions 6' of the conductive material 6 (e.g., the second conductive material and/or metal material used to form control gates 42/wordlines 2) in a particular loop 4 is substantially the same throughout the width of the loop 4, and the distance between substantially vertical portions 6" of the conductive material 6 is substantially the same throughout the length of the loop 4. By way of example, the distance between adjacent loops 4 may be from approximately 10 nm to approximately 30 nm, such as approximately 20 nm. The distance between substantially vertical portions 6", 6" of a single loop 4 may be between approximately 10 nm and approximately 30 nm, such as approximately 20 nm.

Utilizing methods according to embodiments of the present invention to form the loops 4 of conductive material 6 having the uniform pattern may be easier than conventional processes of forming conductive lines because there is no transition to a more widely spaced region within the loop 4 of the conductive material 6. Since the conductive material 6 in the loops 4 is evenly spaced, the contacts 16 to the conductive lines may be more easily formed.

As shown in FIGS. 16 and 17, each loop 4 of the conductive material 6 is etched in two locations, forming two control gates 42/wordlines 2, with one etched location in a first region 54 of the conductive material 6 forming the loop 4 and the other etched location in a second region 56 of the conductive material 6 forming the loop 4. To open the loops 4, a mask having a plurality of apertures 18 may be positioned over the semiconductor device structure 20 being formed such that the apertures 18 are at desired locations and used to etch the conductive material 6. The etching of the loops 4 may be conducted on pitch. The conductive material 6 may be etched using a wet etch process or a dry etch process. By way of example, the conductive material 6 may be etched by exposing the semiconductor device structure 20 to hydrofluoric acid, such as a solution of 1:100 hydrofluoric acid:water. The etch process may be conducted at approximately 30° C. The apertures 18 may be positioned at staggered locations over the semiconductor device structure 20 so that each loop 4 of the conductive material 6 is etched in the two locations. Each of the apertures 18 may be positioned overlying two vertical portions 6" of adjacent loops 4 such that the conductive material 6 of the two, adjacent loops 4 is simultaneously etched. While FIG. 16 illustrates utilizing a single aperture 18 to simultaneously etch locations in adjacent, different loops 4, a single aperture 18 may be used to etch each respective location to be opened in a loop 4. After etching each of the loops 4, the conductive material 6 is no longer continuous and, instead, is opened at two locations, forming the two control gates 42/wordlines 2, as shown in FIG. 17. The etch process may cause ends 58 of the control gates 42/wordlines 2 to be rounded and slightly larger than remaining portions of the control gates 42/wordlines 2, as shown in FIG. 18. The enlarged ends 58 may reduce the space between the control gates 42, which increases the electrical field. The enlarged ends 58 may be further etched to remove or reduce the enlarged ends 58.

Contacts 16 to drive the control gates 42/wordlines 2 may be formed at opposing ends of the loops 4, as shown in FIG. 19. The contacts 16 may be built off the same level. The contacts 16 may enable adjacent control gates 42/wordlines 2 to be driven from opposite sides of the semiconductor device structure 20. To form the contacts 16, a metal nitride material and a metal material may be formed over and in contact with a portion of the horizontal portions 6' of the conductive material 6 and a portion of the vertical portions 6" of the conductive material 6 (see FIG. 17). By way of example, the metal nitride material may be titanium nitride. The metal nitride may be formed at a thickness of approximately 100 Å. By way of example, the metal nitride material may be deposited by CVD. The metal material may then be formed over the metal nitride material. By way of example, the metal may be tungsten. The metal material may be formed at a thickness of approximately 2000 Å. By way of example, the metal nitride material may be deposited by CVD. Optionally, contact landing pads (not shown) may be formed between the control gates 42/wordlines 2 and the contacts 16 before forming the contacts 16. The resulting contacts 16 may be used to provide contact to the control gates 42/wordlines 2 without utilizing a so-called "shark jaw" layout. While some method embodiments of the present invention may utilize additional processing acts, such as planarization, relative to conventional processes, the advantage of being able to print a uniform pattern of conductive material 6 is believed to outweigh this potential disadvantage.

Figure 20:
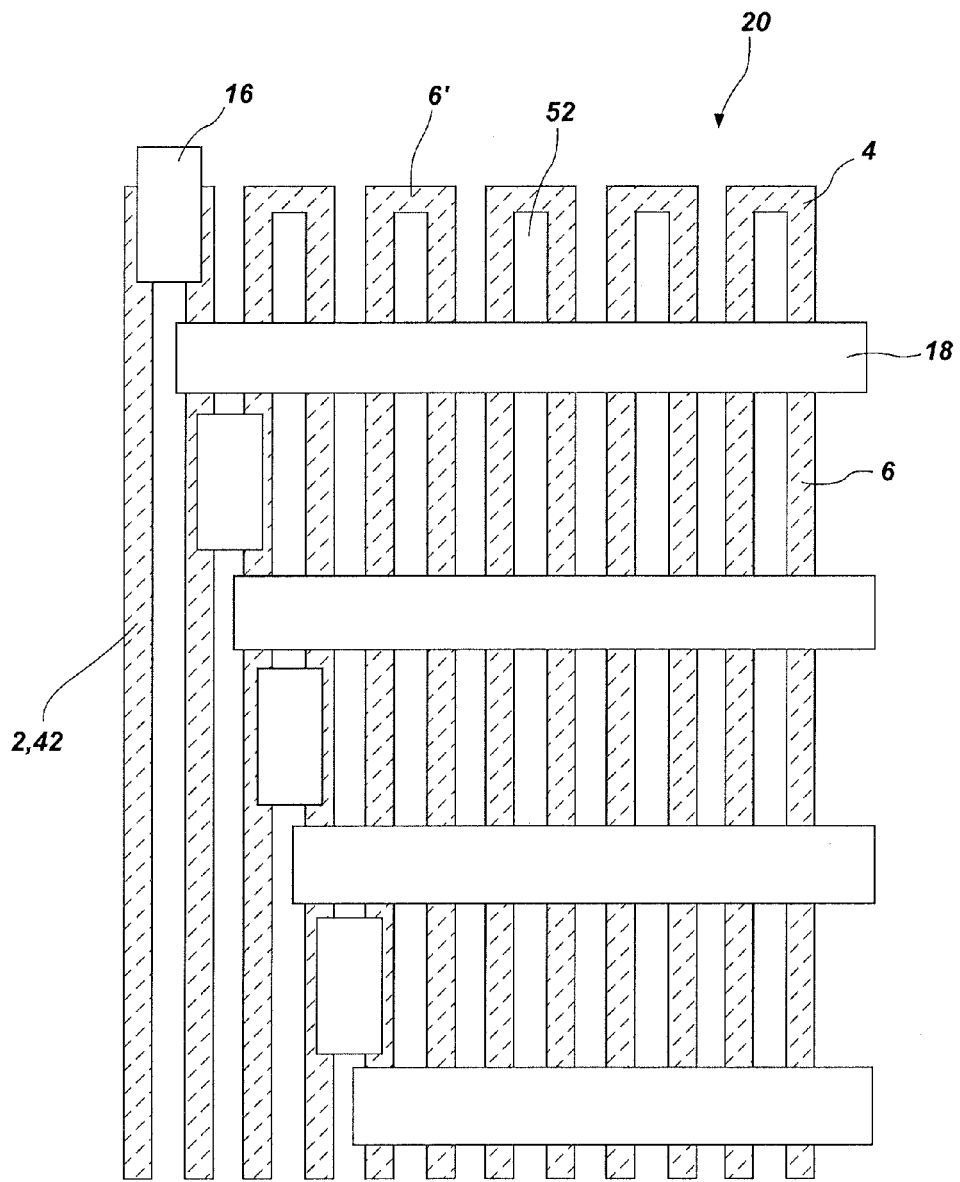
FIGS. 20 and 21 are top down views of the semiconductor device structure of FIG. 14 illustrating opening of wordlines according to another embodiment of the present invention.
Figure 21:
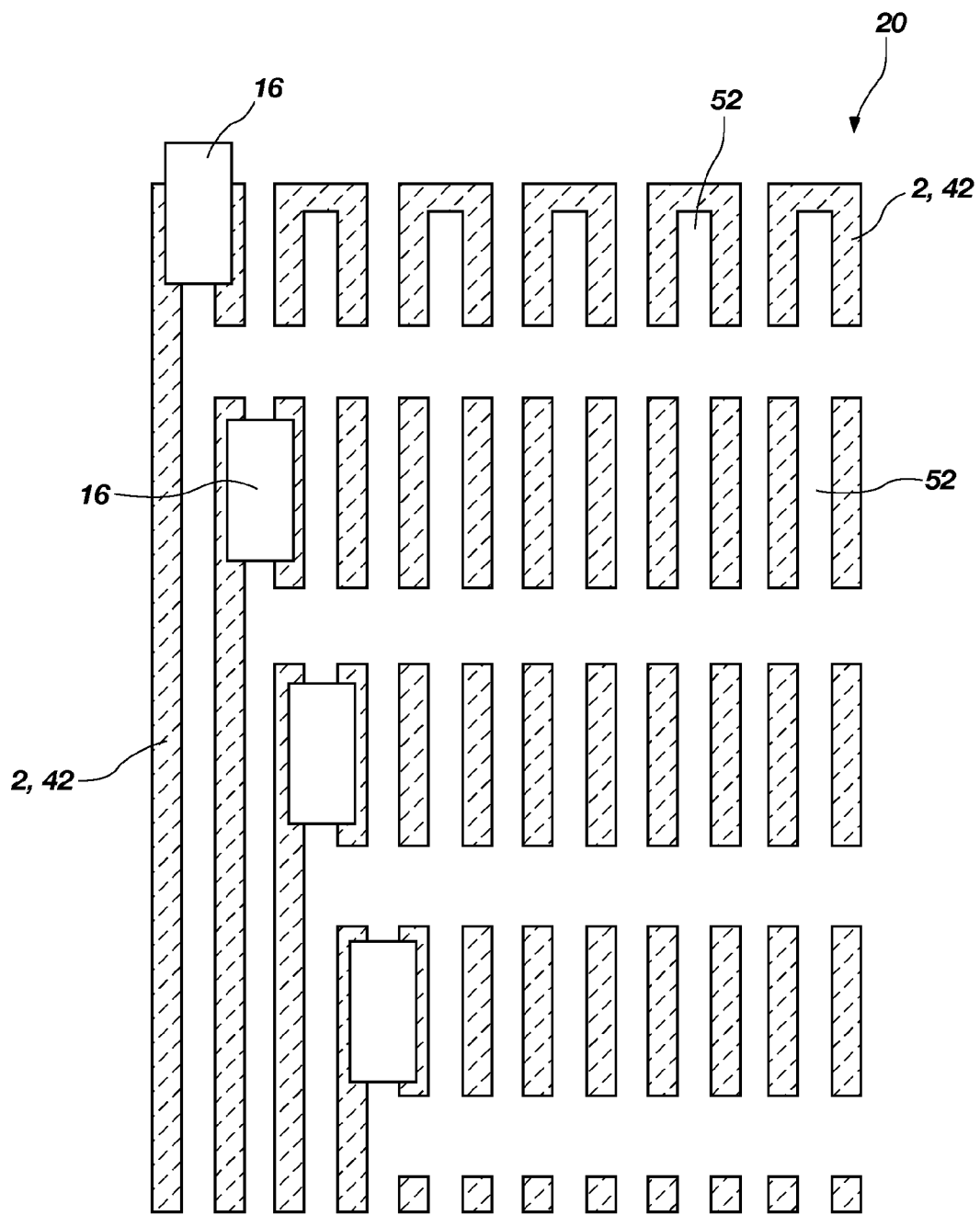

Such as to improve timing of the control gates 42/wordlines 2, for example, in another embodiment, adjacent control gates 42/wordlines 2 may be driven from the same side of the semiconductor device structure 20, as shown in FIGS. 20 and 21. Loops 4 of the conductive material 6 may be formed as described in regard to FIGS. 4-15. For simplicity, FIGS. 20 and 21 only illustrate a portion of the loops 4 of the conductive material 6. The loops 4 may then be opened at least one location using apertures 18 in a mask, where the apertures 18 are positioned over desired locations of the conductive material 6. In contrast to the position of the apertures 18 in FIG. 16, each of the apertures 18 in FIG. 20 may be positioned in a substantially horizontal orientation extending across the width of the semiconductor device structure 20. The apertures 18 may be positioned perpendicular to the horizontal portions 6' of the conductive material 6. Each of the apertures 18 may be substantially parallel to one another and spaced apart from one another so that each aperture 18 overlies a portion of multiple loops 4 of the conductive material 6. The apertures 18 may be spaced apart a sufficient distance such that contacts 16 may be formed on the conductive material 6 therebetween. The loops 4 may be etched using the apertures 18 as described above in regard to FIGS. 16 and 17. After etching the conductive material 6 to form the control gates 42/wordlines 2, the contacts 16 may be formed in contact with the control gates 42/wordlines 2. The contacts 16 may be formed in spaces between the locations where the apertures 18 were previously positioned. The contacts 16 may be formed as described above in regard to FIG. 19.

CONCLUSION

In one embodiment, the present invention includes a method of forming a semiconductor device structure that comprises forming a plurality of loops of a conductive material. Each loop of the plurality of loops comprises a uniform pattern. A portion of the conductive material is removed from at least one location in each loop of the plurality of loops. Contacts are formed to the conductive material.

In an additional embodiment, the present invention includes a semiconductor device structure that comprises a plurality of loops of conductive material. Each loop of the plurality of loops has a uniform pattern and at least one opening and two vertical portions. The at least one opening is in at least one location of at least one of the two vertical portions. The device structure also includes a plurality of contacts. Each of the plurality of contacts is electrically connected with a respective one of the vertical portions of the plurality of loops.

While the present invention is susceptible to various modifications and alternative forms, specific embodiments have been shown by way of example in the drawings and have been described in detail herein. However, the invention is not intended to be limited to the particular forms disclosed. Rather, the invention is to cover all additions, deletions, modifications, equivalents, and alternatives falling within the scope of the invention as defined by the following appended claims and their legal equivalents.

What is claimed is:

1. A method of forming a semiconductor device structure, comprising:
   forming a plurality of loops of a conductive material over a semiconductor substrate, each loop of the plurality of loops comprising a uniform pattern comprising two substantially vertical portions and at least one substantially horizontal portion, and each loop of the plurality of loops comprising a substantially uniform length;
   removing a portion of the conductive material from at least one location in each loop of the plurality of loops to form at least one opening in the at least one location in each loop; and
   forming contacts, each contact electrically connected to a respective one of the substantially vertical portions of the plurality of loops.

2. The method of claim 1, wherein forming a plurality of loops of a conductive material comprises forming a plurality of loops where each loop of the plurality of loops comprises two substantially horizontal portions, the two substantially vertical portions substantially perpendicular to the two substantially horizontal portions.

3. The method of claim 2, wherein forming a plurality of loops where each loop of the plurality of loops comprises two substantially horizontal portions comprises forming each loop of the plurality of loops such that a distance between the two substantially vertical portions of each loop is substantially the same and the distance between the two substantially horizontal portions of each loop is substantially the same.

4. The method of claim 2, wherein forming a plurality of loops where each loop of the plurality of loops comprises two at least substantially horizontal portions comprises forming the two at least substantially vertical portions parallel to one another and the two at least substantially horizontal portions parallel to one another.

5. The method of claim 1, wherein removing a portion of the conductive material from at least one location in each loop of the plurality of loops comprises removing the portion of the conductive material on pitch.

6. The method of claim 1, wherein removing a portion of the conductive material from at least one location in each loop of the plurality of loops comprises removing the portion of the conductive material from at least two locations in each loop of the plurality of loops.

7. The method of claim 6, wherein removing the portion of the conductive material from at least two locations in each loop of the plurality of loops comprises removing a portion of one substantially vertical portion and removing a portion of another substantially vertical portion in each loop of the plurality of loops.

8. The method of claim 6, wherein removing the portion of the conductive material from at least two locations in each loop of the plurality of loops comprises positioning a mask having a plurality of apertures over the plurality of loops such that at least one aperture of the plurality of apertures overlies the at least two locations of at least one loop of the plurality of loops and removing the underlying conductive material.

9. The method of claim 8, wherein positioning a mask over the plurality of loops comprises positioning each aperture of the plurality of apertures over two locations in adjacent loops.

10. The method of claim 8, wherein removing the portion of the conductive material from at least two locations in each loop of the plurality of loops comprises removing portions of the substantially vertical portions underlying the at least one aperture of the plurality of apertures such that the conductive material of the two adjacent loops is simultaneously etched.

11. The method of claim 6, wherein removing the portion of the conductive material from at least two locations in each loop of the plurality of loops comprises positioning a mask having a plurality of apertures over the plurality of loops such that each aperture of the plurality of apertures is positioned over a portion of at least one of the two substantially vertical portions and removing the underlying conductive material of the portion of the at least one of the two substantially vertical portions.

12. The method of claim 6, wherein removing the portion of the conductive material from at least two locations in each loop of the plurality of loops comprises forming two conductive lines from each loop of the plurality of loops.

13. The method of claim 1, wherein removing a portion of the conductive material from at least one location in each loop of the plurality of loops comprises positioning a mask having a plurality of apertures over the plurality of loops such that each aperture of the plurality of apertures overlies locations in at least two of the plurality of loops and removing the underlying conductive material.

14. The method of claim 13, wherein positioning a mask having a plurality of apertures over the plurality of loops comprises positioning the mask such that the plurality of apertures extend in a direction substantially perpendicular to the substantially vertical portions of the plurality of loops.

15. The method of claim 13, wherein positioning a mask having a plurality of apertures over the plurality of loops comprises positioning a mask having a plurality of apertures substantially parallel to and spaced apart from one another.

16. The method of claim 1, wherein forming contacts, each contact electrically connected to a respective one of the substantially vertical portions of the plurality of loops comprises forming contacts at opposing ends of each loop of the plurality of loops.

17. A semiconductor device structure, comprising:
    a plurality of loops of conductive material over a semiconductor substrate, each loop of the plurality of loops having a uniform pattern, at least one opening, at least one horizontal portion, and two vertical portions, wherein the at least one opening of each loop of the plurality of loops is in at least one location of at least one of the two vertical portions and wherein each loop of the plurality of loops comprises a substantially uniform length; and
    a plurality of contacts, wherein each contact of the plurality of contacts is electrically connected with a respective one of the vertical portions of the plurality of loops.

18. The semiconductor device structure of claim 17, wherein each loop of the plurality of loops has a substantially rectangular shape when viewed from a perspective substantially perpendicular to a surface of the semiconductor substrate over which the plurality of loops is located.

19. The semiconductor device structure of claim 17, wherein the at least one horizontal portion comprises two horizontal portions, a distance between the two horizontal portions of each loop of the plurality of loops is substantially the same throughout a width of each loop of the plurality of loops, and a distance between the two vertical portions of each loop of the plurality of loops is substantially the same throughout the length of each loop of the plurality of loops.

20. The semiconductor device structure of claim 17, wherein adjacent loops of the plurality of loops are separated by a distance of from approximately 10 nm to approximately 30 nm.

21. The semiconductor device structure of claim 17, wherein the plurality of contacts are formed on ends of the loops.

22. The semiconductor device structure of claim 17, wherein contacts of the plurality of contacts electrically connected to the vertical portions of a respective one of the plurality of loops are formed on opposing ends of the respective loops.

23. The semiconductor device structure of claim 17, wherein each of the contacts is vertically and horizontally offset from an adjacent one of the contacts.

24. The semiconductor device structure of claim 17, wherein the at least one horizontal portion comprises two horizontal portions, and wherein each contact of the plurality of contacts is over a portion of at least one of the two vertical portions and is over a portion of one of the two horizontal portions.

25. The semiconductor device structure of claim 17, wherein each contact of the plurality of contacts is electrically connected to and over portions of two of the vertical portions.

26. The semiconductor device structure of claim 25, wherein the two of the vertical portions under a respective one of the contacts are portions of a same one of the loops.

27. The semiconductor device structure of claim 25, wherein the two of the vertical portions under a respective one of the contacts are portions of two different loops.

* * * * *